(12) United States Patent
Pohjonen et al.

(10) Patent No.: US 6,242,843 B1
(45) Date of Patent: Jun. 5, 2001

(54) RESONATOR STRUCTURES

(75) Inventors: Helena Pohjonen, Espoo; Juha Ellä, Halikko, both of (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/321,339

(22) Filed: May 27, 1999

(30) Foreign Application Priority Data

Jun. 2, 1998 (FI) .......................................... 981245

(51) Int. Cl.$^7$ ............... H03H 9/02; H03H 9/145
(52) U.S. Cl. ........................................ 310/313 R
(58) Field of Search ........................ 310/313 R

(56) References Cited

U.S. PATENT DOCUMENTS

| | | | |
|---|---|---|---|
| 5,075,641 | * 12/1991 | Weber et al. | 310/314 |
| 5,373,268 | 12/1994 | Dworsky et al. | 333/187 |
| 5,382,930 | 1/1995 | Stokes et al. | 333/191 |
| 5,714,917 | 2/1998 | Ella | 332/144 |
| 5,747,857 | * 5/1998 | Eda et al. | 310/324 |
| 5,789,845 | * 8/1998 | Wadaka et al. | 310/334 |
| 5,872,493 | 2/1999 | Ella | 333/191 |
| 5,873,154 | 2/1999 | Ylilammi et al. | 29/25.35 |

FOREIGN PATENT DOCUMENTS

| | | | |
|---|---|---|---|
| 0 834 989 A3 | 4/1998 | (EP) . | |
| 3-178206 | * 8/1991 | (JP) | 310/313 R |
| 6-125226 | * 5/1994 | (JP) | 310/313 R |
| 6-125-36 | * 6/1994 | (JP) | 310/313 R |

OTHER PUBLICATIONS

"Acoustic bulk Wave Composite Resonators", Applied Physics Letters, Lakin et al., vol. 38, No. 3, pp. 125–127, Feb. 1, 1981.

"An Air–Gap Type Piezoelectric Composite Thin Film Resonator", Satoh et al., I5 Proc. 39$^{th}$ Annual Symp. Freq. Control, pp. 361–366, Dec. 1985.

"Ferroelectric Thin Films in Microelectromechanical Systems Applications", Polla et al., MRS Bulletin, Jul. 1996, pp. 59–65.

Finnish Search Report.

\* cited by examiner

*Primary Examiner*—Thomas M. Dougherty
(74) *Attorney, Agent, or Firm*—Perman & Green, LLP

(57) ABSTRACT

The invention relates to resonator structures of radio communication apparatus. According to the invention, at least one resonator structure and at least one switch structure are manufactured on the same substrate during the same process. This is especially advantageous when using bridge type BAW resonators and micromechanical switches, since the same process steps which are used for creating the bridge structures, can be used to create the micromechanical switch structure. Integration of switch structures and resonators on the same substrate allows the manufacture of very compact filter and resonator structures needed for multi-system mobile communication means. According to another aspect of the invention a special property of BAW resonators is utilized, namely that BAW resonators can be integrated on substrates which are commonly used for active circuitry, such as silicon (Si) and gallium arsenide (GaAs) surfaces. According to this aspect of the invention, the switches are realized with transistor structures using, for example, MESFET transistors.

10 Claims, 7 Drawing Sheets

RESONATOR STRUCTURES

TECHNICAL FIELD OF THE INVENTION

The invention relates to resonator structures of radio communication apparatus.

BACKGROUND OF THE INVENTION

The development of mobile telecommunications continues towards ever smaller and increasingly complicated handheld units. The development has recently lead to new requirements for handheld units, namely that the units should support several different standards and telecommunications systems. Supporting several different systems requires several sets of filters and other RF components in the RF parts of the handheld units. Despite this complexity, the size of a handheld unit should not increase as a result of such a wide support.

The RF filters used in prior art mobile phones are usually discrete surface acoustic wave (SAW) or ceramic filters. This approach has been adequate for single standard phones, but does not allow support of several telecommunications systems without increasing the size of a mobile phone.

Surface acoustic wave (SAW) resonators typically have a structure similar to that shown in FIG. 1. Surface acoustic resonators utilize surface acoustic vibration modes of a solid surface, in which modes the vibration is confined to the surface of the solid, decaying quickly away from the surface. A SAW resonator typically comprises a piezoelectric layer 100, and two electrodes 122, 124. Various resonator structures such as filters are produced with SAW resonators. A SAW resonator has the advantage of having a very small size, but unfortunately cannot withstand high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layers of zinc oxide (ZnO) sputtered over a thin membrane of silicon (Si). Further, in an article entitled "An Air-Gap Type Piezoelectric Composite Thin Film Resonator", I5 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

FIG. 2 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away a sacrificial layer. The gap serves as an acoustic isolator, essentially isolating the vibrating resonator structure from the substrate.

Bulk acoustic wave resonators are not yet in widespread use, partly due to the reason that feasible ways of combining such resonators with other circuitry have not been presented. However, BAW resonators have some advantages as compared to SAW resonators. For example, BAW structures have a better tolerance of high power levels.

Micromechanical devices are also presently under development. A micromechanical device is created typically on silicon substrates using deposition, patterning and etching techniques to create the desired structure. As an example, FIG. 3 illustrates the structure of a micromechanical switch. A micromechanical switch comprises a cantilever 400, contact pads 430 on the substrate 200 and a contacting bar 440 for creating a contact between the contact pads 430, and two electrodes 410, 420. The cantilever electrode 410 is formed on the cantilever and the substrate electrode 420 on the substrate. The contacting bar is formed at one end of the cantilever, and the other end of the cantilever is fixed to the substrate, preferably with a support 405 in order to raise the cantilever away from the substrate surface. The micromechanical switch is operated with a DC voltage coupled between the cantilever and substrate electrodes. The DC voltage creates an electrostatic force between the cantilever and substrate electrodes of the switch. The electrostatic force bends the cantilever, bringing the contacting bar into contact with the substrate contact pads 430. Various other micromechanical structures are disclosed in an article entitled "Ferroelectric Thin Films in Microelectromechanical Systems Applications", MRS Bulletin, July 1996, pp. 59–65, by D. L. Polla and L. F. Francis, and references contained therein.

SUMMARY OF THE INVENTION

An object of the invention is to enable the fabrication of structures allowing integration of bulk acoustic wave resonators with other circuitry in an advantageous way. Another object of the invention is to provide switched resonator structures. A further object of the invention is to provide such structures having a very small size. An object of the invention is to decrease the size of filter structures required for multi-system mobile communication means.

The objects are reached by integrating the resonator elements and the switch elements on the same substrate. Preferably, the resonator elements and the switch elements are integrated on the substrate during the same process.

The resonator structure according to the invention is characterized by that, which is specified in the characterizing part of the independent claim directed to a resonator structure. The mobile communication means according to the invention is characterized by that, which is specified in the characterizing part of the independent claim directed to a mobile communication means. The dependent claims describe further advantageous embodiments of the invention.

According to the invention, at least one resonator structure and at least one switch structure are manufactured on the same substrate during the same process. This is especially advantageous when using bridge type BAW resonators and micromechanical switches, since the same process steps which are used for creating the bridge structures, can be used to create the micromechanical switch structure. Integration of switch structures and resonators on the same substrate allows the manufacture of very compact filter and resonator structures needed for multi-system mobile communication means.

According to another aspect of the invention a special property of BAW resonators is utilized, namely that BAW resonators can be integrated on substrates which are commonly used for active circuitry, such as silicon (Si) and gallium arsenide (GaAs) surfaces. According to this aspect of the invention, the switches are realized with transistor structures using, for example, MESFET transistors.

BRIEF DESCRIPTION OF THE DRAWINGS

The invention is described in more detail in the following with reference to the accompanying drawings, of which

Same reference numerals are used for similar entities in the figures.

DETAILED DESCRIPTION

According to the invention, switching means such as micromechanical switches and resonators are realized on a single substrate. The resonators are either surface acoustic wave (SAW) or bulk acoustic wave (BAW) resonators.

Bulk acoustic wave resonators are typically fabricated on silicon (Si), gallium arsenide (GaAs), glass, or ceramic substrates. One ceramic substrate type, which is widely used, is alumina. The BAW devices are typically manufactured using various thin film manufacturing techniques, such as for example sputtering, vacuum evaporation or chemical vapour deposition. BAW devices utilize a piezoelectric thin film layer for generating the acoustic bulk waves. The resonance frequencies of typical BAW devices range from 0.5 Ghz to 5 Ghz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:
an acoustically active piezoelectric layer,
electrodes on opposite sides of the piezoelectric layer, and
acoustical isolation from the substrate.

The piezoelectric layer may be for example, ZnO, AlN, ZnS or any other piezoelectric material that can be fabricated as a thin film. As a further example, also ferroelectric ceramics can be used as the piezoelectric material. For example, $PbTiO_3$ and $Pb(Zr_xT_{1-x})O_3$ and other members of the so called lead lanthanum zirconate titanate family can be used.

Preferably, the material used to form the electrode layers is an electrically conductive material having a high acoustic impedance. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta).

The acoustical isolation can be produced with for example the following techniques:
with a substrate via-hole,
with a micromechanical bridge structure, or
with an acoustic mirror structure.

However, the invention is not limited to these three techniques, since any other way of isolating the resonator from the substrate can be used as well.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure.

Figure 4:
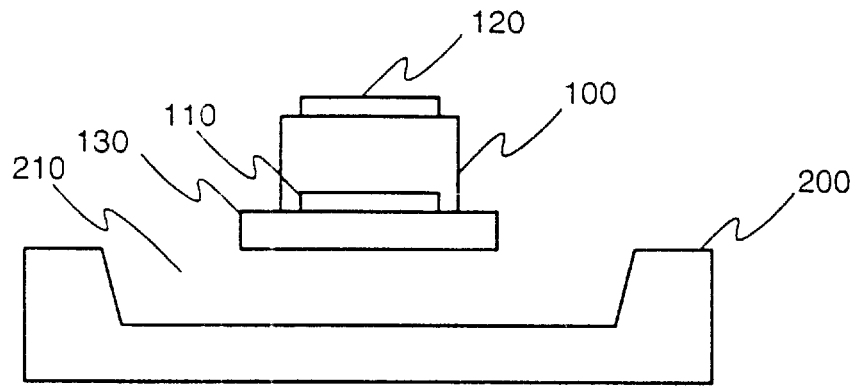
FIG. 4 shows a sectional view of a bulk acoustic wave resonator having a bridge structure.
Figure 5:
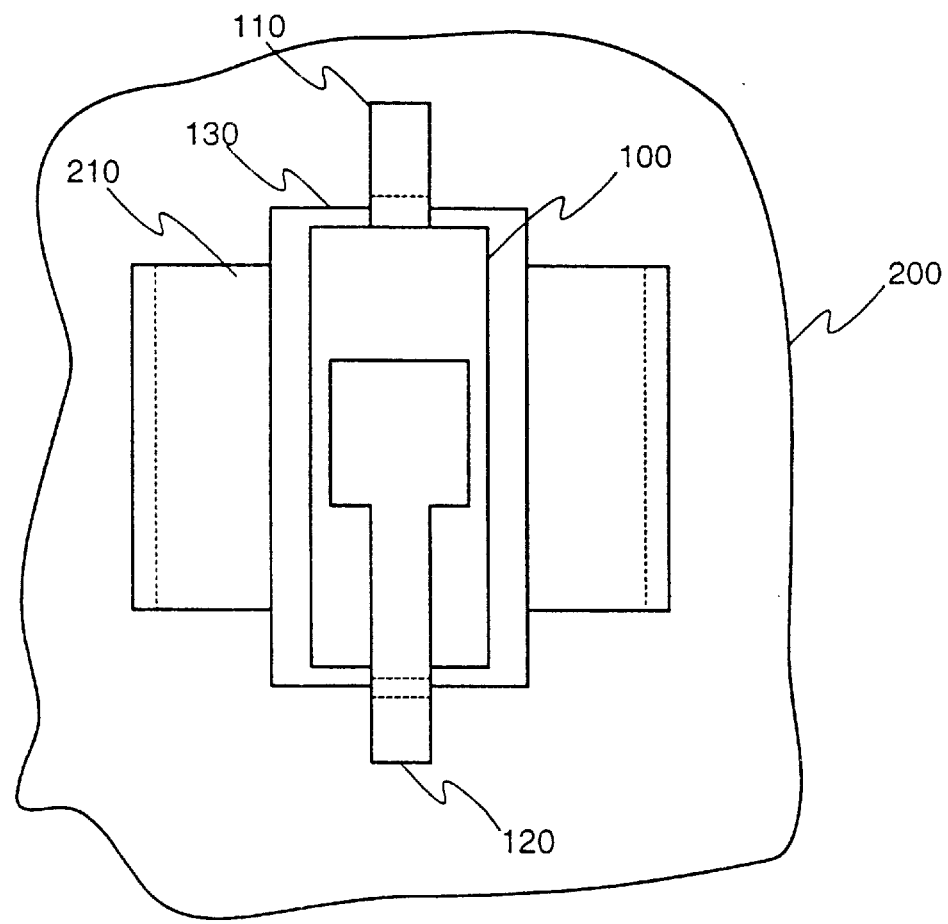
FIG. 5 shows a top view of the structure in FIG. 4.

Bridge structures can be realized, for example, using an etch pit structure. FIGS. 4 and 5 illustrate a BAW with an etch pit structure. FIGS. 4 and 5 show the substrate 200, a membrane layer 130, the bottom electrode 110, the piezoelectric layer 100, and the top electrode 120. FIG. 4 presents a sectional view of the structure, while FIG. 5 shows a top view of the structure. In the etch pit structure, the etch pit 210 is etched under the BAW structure after deposition of at least the membrane layer 130.

Figure 6:
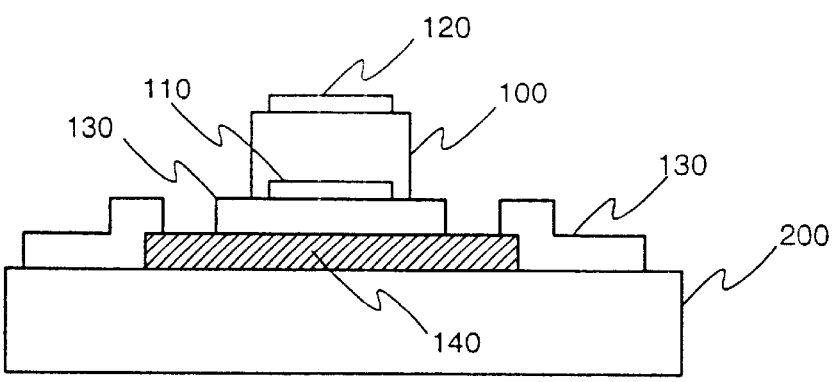
FIG. 6 shows another bulk acoustic wave resonator structure having a bridge structure.

FIG. 6 illustrates another way of producing a bridge structure. Before the deposition of other layers of the BAW structure, a sacrificial layer 140 is deposited and patterned first. The rest of the BAW structure is deposited and patterned partly on top of the sacrificial layer 140. After the rest of the BAW structure is completed, the sacrificial layer 140 is etched away. FIG. 6 shows also the substrate 200, a membrane layer 130, the bottom electrode 110, the piezoelectric layer 100, and the top electrode 120.

The sacrificial layer is preferably realized using a metal or a polymer as the material. For example, the sacrificial layer may be produced using copper (Cu) as the material. The polymer is preferably such a polymer, which can withstand the relatively high temperatures, that can be reached during the deposition of the other layers. The polymer may be, by example, polytetrafluoroethylene or a derivative thereof, polyphenylene sulfide, polyetheretherketone, poly(para phenylene benzobismidazole) poly(para phenylene benzobisoxazole), poly (para phenylene benzobismidazole), poly(para phenylene benzobisthiazole), a polyimide, polyimide siloxane, vinyle ethers, polyphenyl, parylene-n, parylene-f, or benzocyclobutene.

The sacrificial layer may be formed of any other material used in prior art, such as zinc oxide (ZnO). However, the use of a metal or a polymer is preferred as described previously.

Figure 7:
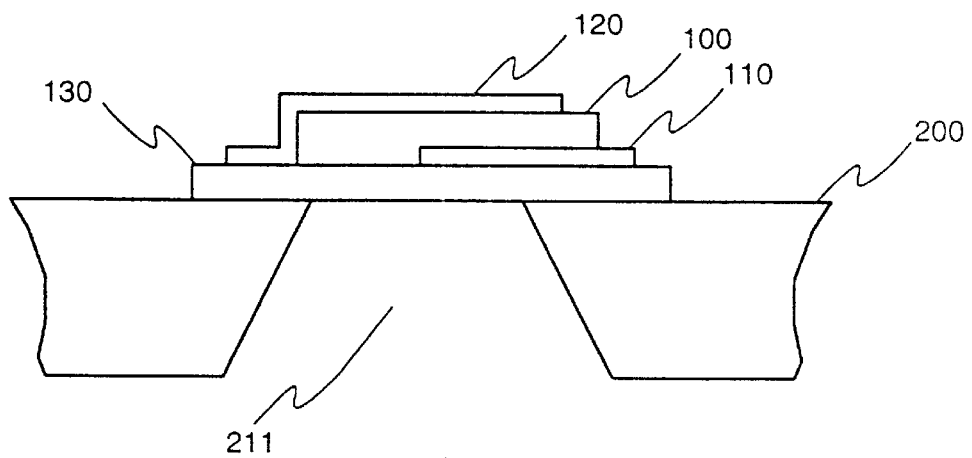
FIG. 7 illustrates a bulk acoustic wave resonator having a via-hole structure.

In the via-hole structure, the resonator is acoustically isolated from the substrate by etching away the substrate from under a major portion of the BAW resonator structure. FIG. 7 illustrates a via-hole structure of a BAW resonator. FIG. 7 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprise several layers having a thickness of one quarter wavelength at the center frequency, alternating layers having differing acoustical impedances. The number of layers in an acoustic mirror is an odd integer, typically ranging from three to nine. The ratio of acoustic impedance of two consecutive layers should be large in order to present as low acoustic impedance as possible to the BAW resonator, instead of the relatively high impedance of the substrate material. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate.

The polymer layer may be comprised of any polymer material having a low loss characteristic and a low acoustic impedance. Preferably, the polymer material is such that it can withstand temperatures of at least 350° C., since relatively high temperatures may be achieved during deposition of other layers of the acoustical mirror structure and other structures. The polymer layer may be comprised of, by example, polyimide, cyclotene, a carbon-based material, a silicon-based material or any other suitable material.

Figure 8:
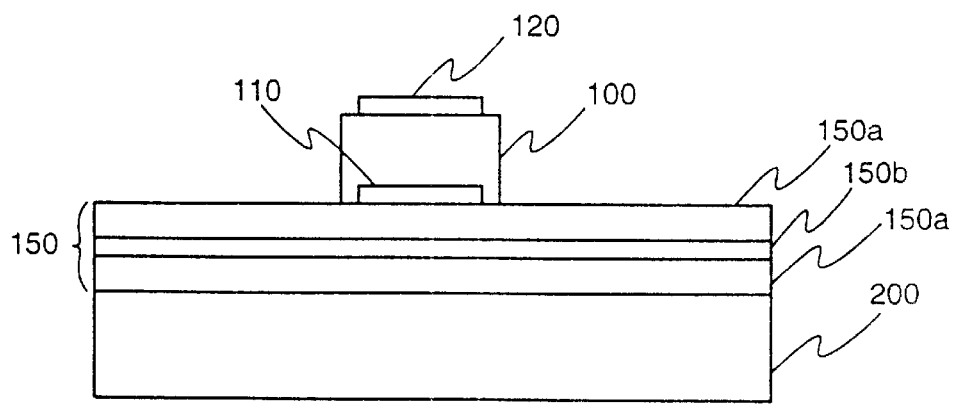
FIG. 8 illustrates a bulk acoustic wave resonator isolated from the substrate by an acoustic mirror structure.

FIG. 8 shows an example of a BAW resonator on top of an acoustical mirror structure. FIG. 8 shows the substrate 200, the bottom electrode 110, the piezoelectric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be different in different embodiments of the invention. In some embodiments of the invention, the material with a high acoustical impedance can be in the middle and the material with a low acoustical impedance on both sides of the middle material. In other embodiments of the invention, the order can be opposite. The bottom electrode may in some embodiments of the invention function as one layer of the acoustical mirror.

Figure 9:
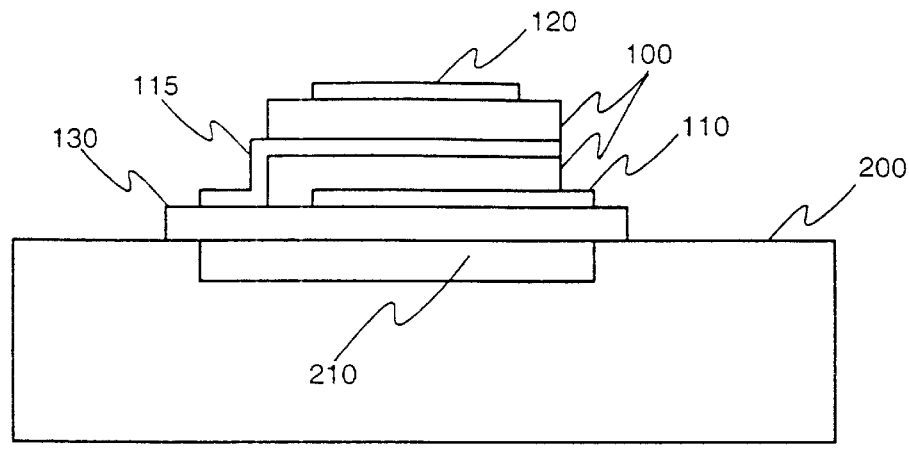
FIG. 9 illustrates a bulk acoustic wave resonator having a stacked structure.

FIG. 9 shows a further BAW resonator structure according to an advantageous embodiment of the invention. FIG. 9 shows a stacked resonator structure having two piezoelectric layers 100. In addition to the bottom 110 and top 120 electrodes, a stacked structure requires a middle electrode 115, which is connected to ground potential. FIG. 9 further shows the membrane layer 130, the substrate 200 and the etch pit 210 isolating the structure from the substrate.

For clarity, any passivation layers commonly needed for manufacturing micro-electronic and micromechanical structures are not drawn in the figures of this specification.

Figure 1:
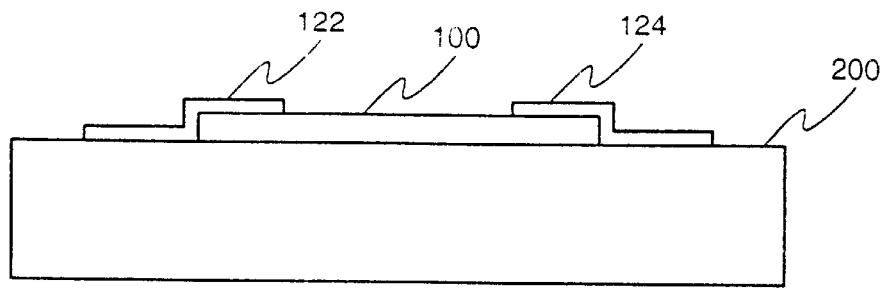
FIG. 1 illustrates a surface acoustic resonator according to prior art.
Figure 2:
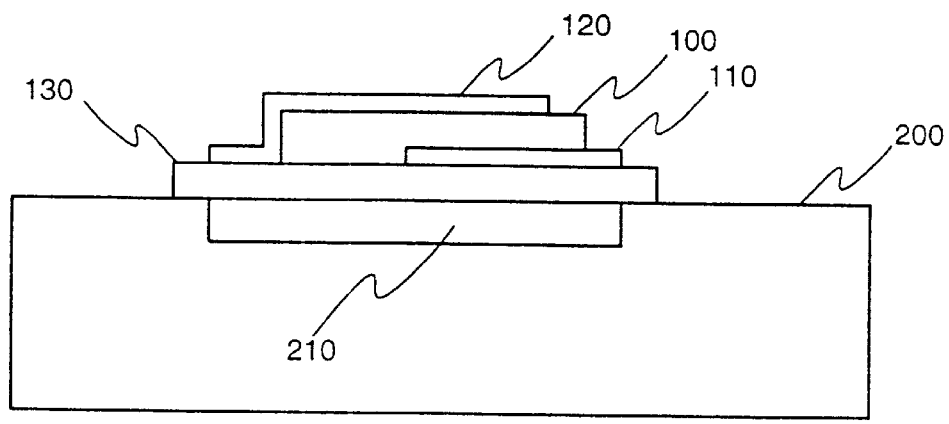
FIG. 2 illustrates a bulk acoustic wave resonator according to prior art.
Figure 3:
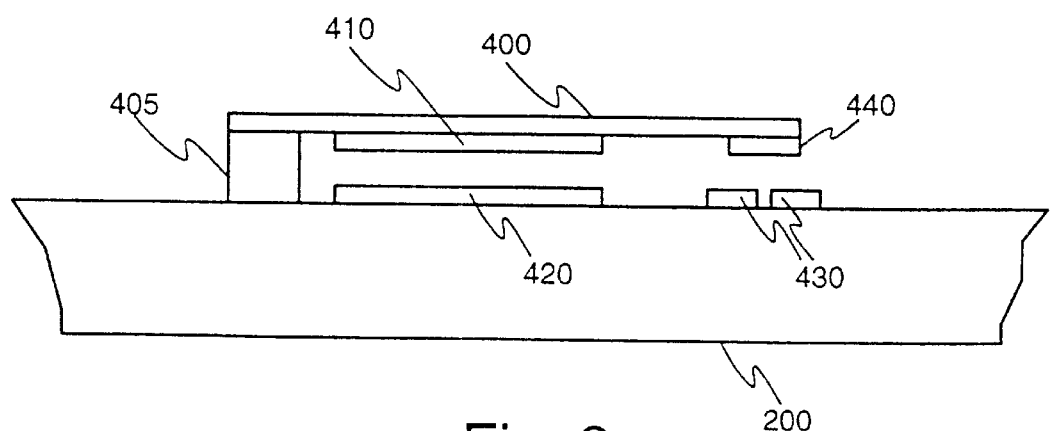
FIG. 3 illustrates a micromechanical switch structure according to prior art.
Figure 13:
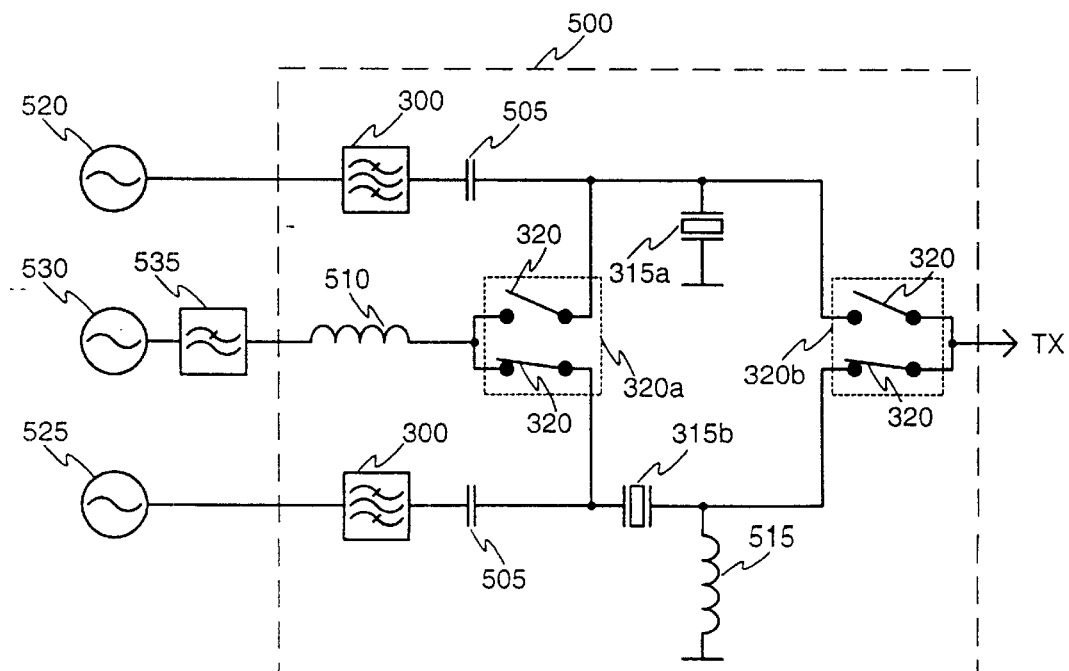
FIG. 13 illustrates the use of bulk acoustic wave resonators and micromechanical switches in a modulator structure according to the invention.

In one embodiment of the invention, micromechanical switches are used to perform switching of signals to and from bulk acoustic wave resonators and surface acoustic wave resonators. Any micromechanical switch structures, such as those similar to the structure presented in FIG. 3, can be used in a structure according to the invention. More complicated switch structures such as multipole switches can be produced by combining more than one basic switches of FIG. 3 and controlling them in a desired way to produce the desired switch function. One example of a more complicated switch structure is shown in FIG. 13, which is described later in this specification.

In an advantageous embodiment of the invention, the switch elements and the resonator elements are fabricated during the same process, whereby the switch and resonator elements have layers, which are fabricated during the same process steps. For example, a metal layer deposited on the substrate may after subsequent patterning form one of the electrodes of a BAW resonator and one of the electrodes of a micromechanical switch. This is especially advantageous when using bridge type BAW resonators and micromechanical switches, since the same process steps which are used for creating the bridge structures, can be used to create the micromechanical switch structure. For example, the sacrificial layer under a bridge structure and the sacrificial layer under a switch cantilever, which sacrificial layers are etched away at a later stage, can be part of a single patterned layer.

In such an embodiment, in which the substrate is made of silicon (Si), gallium arsenide (GaAs) or some other material suitable for use as a substrate for integrated circuits, also other elements than switching transistors can be realized on the same substrate. For example, other circuits such as amplifiers can be integrated on the same substrate, which allows integration of nearly all RF components of a mobile communication means on a single substrate.

Figure 10:
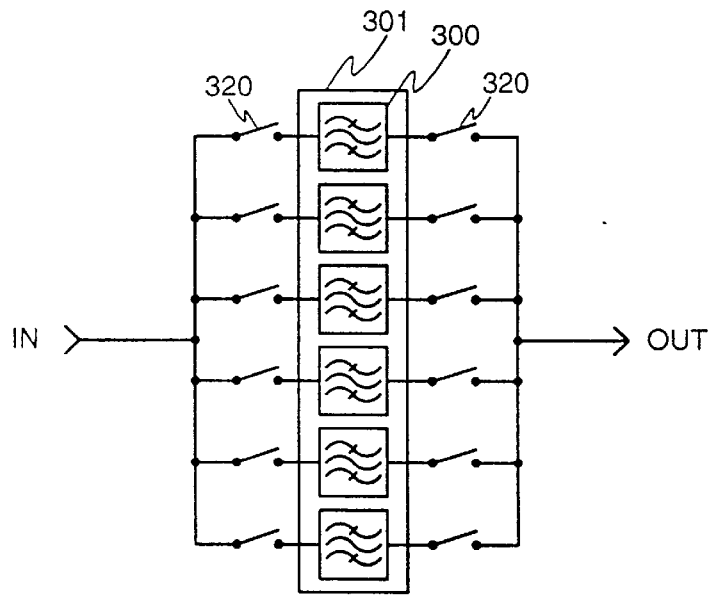
FIG. 10 illustrates a switch and resonator structure according to the invention.

The resonator and switch structures according to the invention can be used, for example, to realize switched filter banks. One possible application of a switched filter bank 301 according to the invention is shown in FIG. 10. The embodiment of FIG. 10 can be used for example in filtering of a narrow part of a transmission or a receiving band. The filter bank 301 comprises several passband filters 300 having relatively narrow passbands, whereby a portion of a band can be selected for operation by switching the filter with the desired center frequency into use. The switches 320 at the first port of the filters are used to select which filter is used. Since the passbands of adjacent filters overlap each other to some extent, it is very difficult to match the filters at the second filter port if all the other filters, i.e. unused filters, are connected to the other port causing loading of the second port. The unused filters would present a frequency dependent reactance, which is seen as shunt reactance at the second port. This problem can be solved by using a second switch 320 to each filter, as is shown in FIG. 10. In such applications, where the passbands of the filters are relatively far apart, the switches at the second ports, i.e. output ports of the filters, may not be needed. The filter bank structure of FIG. 10 can be used to limit the noise and disturbing signals which the receiver receives from a single receiving band. At the transmission side, such a filter bank can clean up noise generated by the transmission circuitry outside the desired transmission frequencies.

A filter bank 301 can comprise one or more filters in various embodiments of the invention. FIG. 10 shows an example only.

Figure 11:
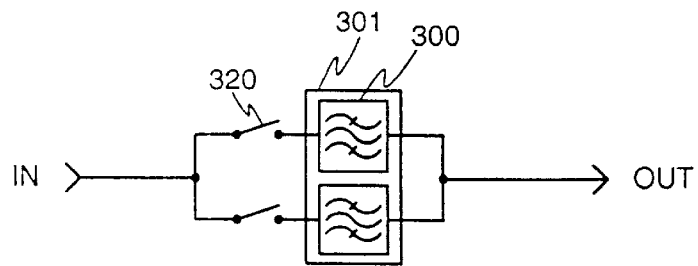
FIG. 11 illustrates a further switch and resonator structure according to the invention.

In an another advantageous embodiment of the invention, a filter bank can be used to select between different operating bands, for example in a mobile communication means, which is arranged to communicate with more than one networks having differing operating bands. FIG. 11 shows a structure according to such an embodiment. In FIG. 11, switches 320 are used only at the input port of the filters 300. In this example, the passbands of the two filters 300 are sufficiently far apart. that the shunt reactance presented to the output port of the filter in use does not affect the passband of the filter in use too much. The switches 320 at the input port of the filters are used to select the desired filter. The arrangement shown in FIG. 11 can be used in a receiver structure as well as in a transmitter structure.

Figure 12A:
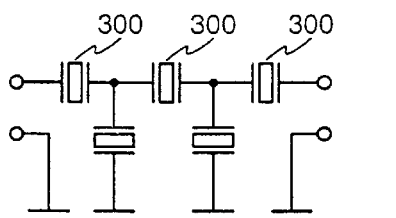
FIGS. 12a, 12b, and 12c illustrate various filter structures obtainable with bulk acoustic wave resonators.
Figure 12B:
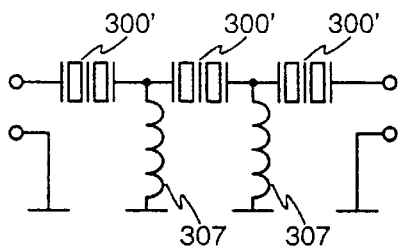
Figure 12C:
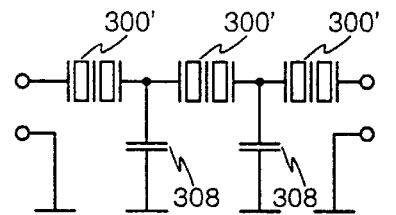

Filters that utilize bulk acoustic wave resonators can comprise more than one resonator. FIGS. 12*a*, 12*b*, and 12*c* shows various filter structures, which can be used according to various embodiments of the invention. FIG. 12*a* illustrates a filter constructed from several bulk acoustic wave resonators 300 having a single piezoelectric layer. Using several resonators in a ladder topology as shown in FIG. 12*a* provides in most cases better filtering properties than using a single resonator only. FIG. 12*b* shows a filter structure constructed with bulk acoustic wave resonators 300' with a stacked structure. The filter comprises series coupled resonators 300' with shunt inductors 307 between the resonators. FIG. 12*c* shows a filter structure adapted for narrow bandwith operation. The structure is otherwise similar to the structure of FIG. 12*b*, but instead of shunt inductors, shunt capacitors 308 are used. The structures of FIGS. 12*a*, 12*b*, and 12*c* can be used, for example, in switched filter bank structures such as those shown in FIGS. 10 and 11.

Bulk acoustic wave resonators can be used for realizing filters as described previously. Bulk acoustic wave resonators can also be used as modulators for producing amplitude modulated signals and phase modulated signals. The properties such as the resonance frequencies of the resonator change slightly, if a substantially constant voltage is applied between the electrodes, since the frequency response of the resonator is different when the resonator is bent in one direction than when the resonator is not bent. This property allows the creation of tunable resonators and filters. Further, this property can be used in modulator structures realized using bulk acoustic wave resonators. Since the frequency of a modulating waveform is typically far below that of a radio frequency carrier, the modulating waveform forms a very slow-changing bias for the radio frequency carrier. Consequently, the resonance frequencies change in time according to the modulating waveform. When a radio frequency carrier having a frequency between the series and parallel resonance frequencies of the resonator is fed to the resonator, the resonator causes the RF carrier signal to be attenuated as a function of the modulating low frequency signal, producing amplitude modulation.

The change of the properties of a bulk acoustic wave resonator can be used also in phase modulation. Since the phase shifting effect of a resonator has a sharp maximum at the resonance frequencies of the resonator, a change in the resonance frequencies of the resonator produces a substantially changing amount of phase shift for a radio frequency carrier having a frequency at or near an unmodulated resonance frequency of the resonator.

FIG. 13 illustrates one advantageous embodiment of the invention comprising bulk acoustic wave resonators used as modulators. FIG. 13 shows the structure of a dual band modulator of a mobile communication means. The dual band modulator structure 500 receives a first radio frequency carrier from a first radio frequency carrier source 520, and a second radio frequency carrier from a second radio frequency carrier source 525. Both carriers are first band pass filtered in a band pass filter 300 constructed using a bulk acoustic wave resonator, after which both carrier signals are taken through a capacitor 505 which functions as a low frequency block to prevent the low frequency modulating signal from propagating to the band pass filters and carrier signal sources.

The modulating low frequency signal is received from a modulating signal source 530. The modulating signal is low pass filtered in a low pass filter 535 and taken through an inductor 510, which functions as a high frequency block to prevent the carrier signals from propagating to the low pass filter and modulation signal source. From the inductor 510, the modulating signal is taken to a first switch block 320*a* comprising two micromechanical switches 320. The first switch block is used to select the carrier signal to be modulated. Depending on the position of the two switches of the first switch block, the modulating signal is lead to the first radio frequency carrier signal line or to the second radio frequency carrier signal line, and thereby to one of the modulators 315*a*, 315*b*. FIG. 13 also illustrates two examples of possible resonator configurations in modulator use, i.e. a resonator coupled in series 315*b* and a resonator coupled in parallel 315*a*. In the series configuration, an inductor 515 is needed to provide a low frequency ground for the resonator 315*b*. A second switch block 320*b* is used to select the modulated signal for transmission. For clarity, signal lines which control the position of switches 320 are not drawn in FIG. 13. The dual band modulator structure components surrounded by the dashed line 500 can advantageously be manufactured on a single chip.

Figure 14:
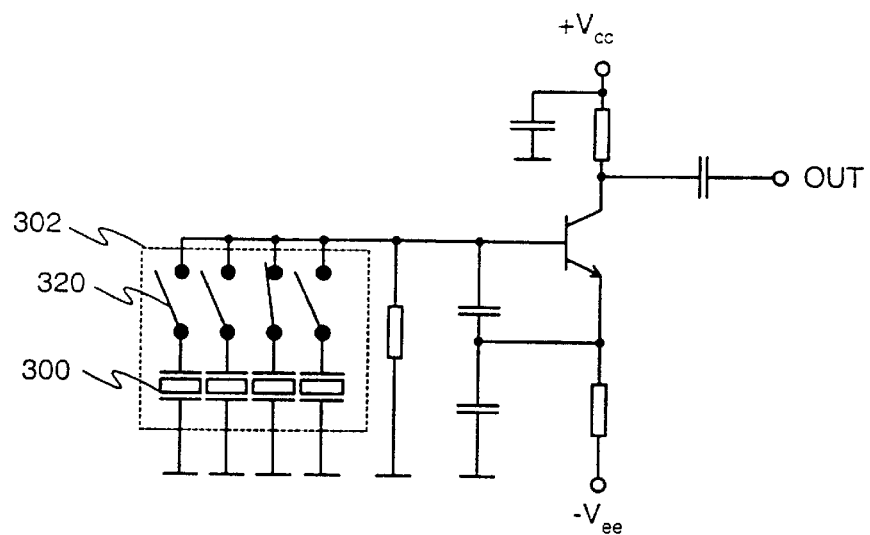
FIG. 14 illustrates the use of bulk acoustic wave resonators and switch elements in oscillator structures.

FIG. 14 shows a further advantageous embodiment of the invention. FIG. 14 illustrates an oscillator circuit of the well known Colpitts type. A bulk acoustic wave resonator and switch bank 302 comprising micromechanical switches 320 and bulk acoustic wave resonators 300 is used for providing several operation frequencies for the oscillator circuit. The desired operating frequency is selected by selecting the corresponding resonator with one of the switches 320. This kind of an oscillator structure can advantageously be used, for example, in a multi-band mobile communication means. For clarity, signal lines which control the position of switches 320 are not drawn in FIG. 14. Resonator and switch structures according to the invention can be used also in many other oscillator structures, and FIG. 14 is shown as an example only. Since a Colpitts oscillator is well known by the man skilled in the art, the functioning and the structure of the oscillator in FIG. 14 is not described here in further detail.

Figure 15:
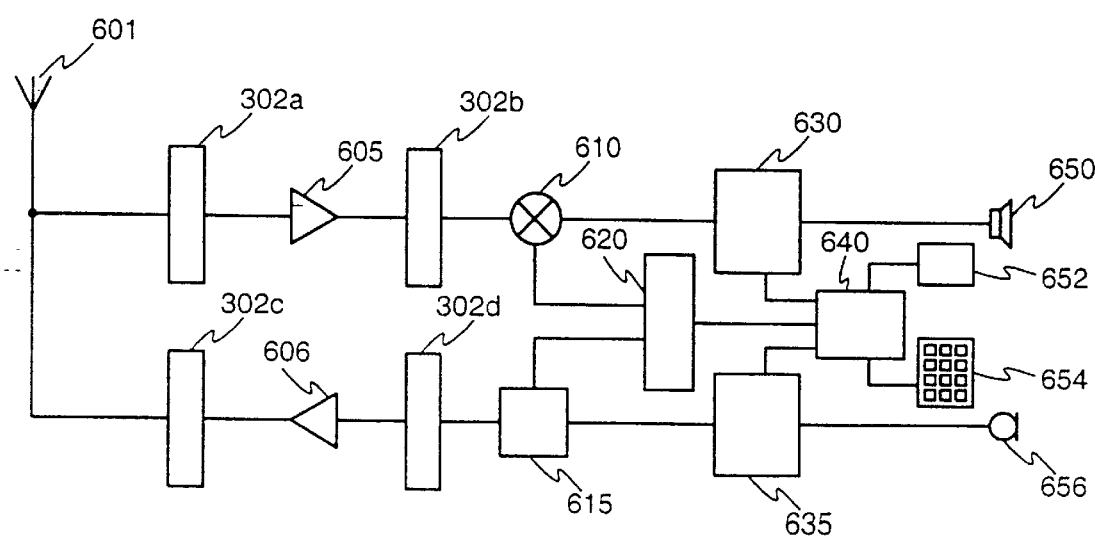
FIG. 15 illustrates the use of switched resonator banks in a mobile communication means according to the invention.

In FIG. 15, a block diagram of a mobile communication means according to a further advantageous embodiment of the invention is shown. The receiver part of the mobile communication means comprises a first receiver switched filter bank 302*a* for filtering the received signal, a receiver amplifier 605 for amplifying the received signal, a second receiver switched filter bank 302*b* for further filtering of the received signal, a mixer 610 for converting the received signal to baseband, a receiver block 630 for demodulating and decoding the signal and an earpiece 650 or a loudspeaker 650 for producing the audible received signal. The transmitter part comprises a microphone 656, a transmitter block 635 for coding the signal to be transmitted and performing other necessary signal processing, a modulator 615 for producing the modulated radio frequency signal, a first transmitter switched filter bank 302*d*, a transmitter amplifier 606, and a second transmitter switched filter bank 302*c*. The mobile communication means further comprises an antenna 601, an oscillator block 620, a control block 640, a display 652 and a keypad 654. The control block 640 controls the functioning of the receiver and transmitter blocks and the oscillator block, as well as displays information to the user via the display 652 and receives commands from the user via the keypad 654. The switched filter banks 302*a*, 302*b*, 302*c*, and 302*d* can have, for example, the structure shown in FIG. 10 or the structure shown in FIG. 11, or a structure which is a combination of the structures in FIGS. 10 and 11, depending on the width and the number of the operating bands of the mobile communication means. Other structures can also be used for the switched filter banks 302a, 302b, 302c, and 302d. The receiver switched filter banks 302a, 302b are used to limit the noise and disturbing signals which the receiver receives from a receiving band. At the transmission side, the transmission switched filter banks 302c, 302d can clean up noise generated by the transmission circuitry outside the desired transmission frequencies. The oscillator block 620 may comprise an oscillator with a switched resonator bank, for example such as shown in FIG. 14. The oscillator block 620 may further comprise a switched filter block for removing unwanted noise from the output of the oscillator circuit.

Figure 16:
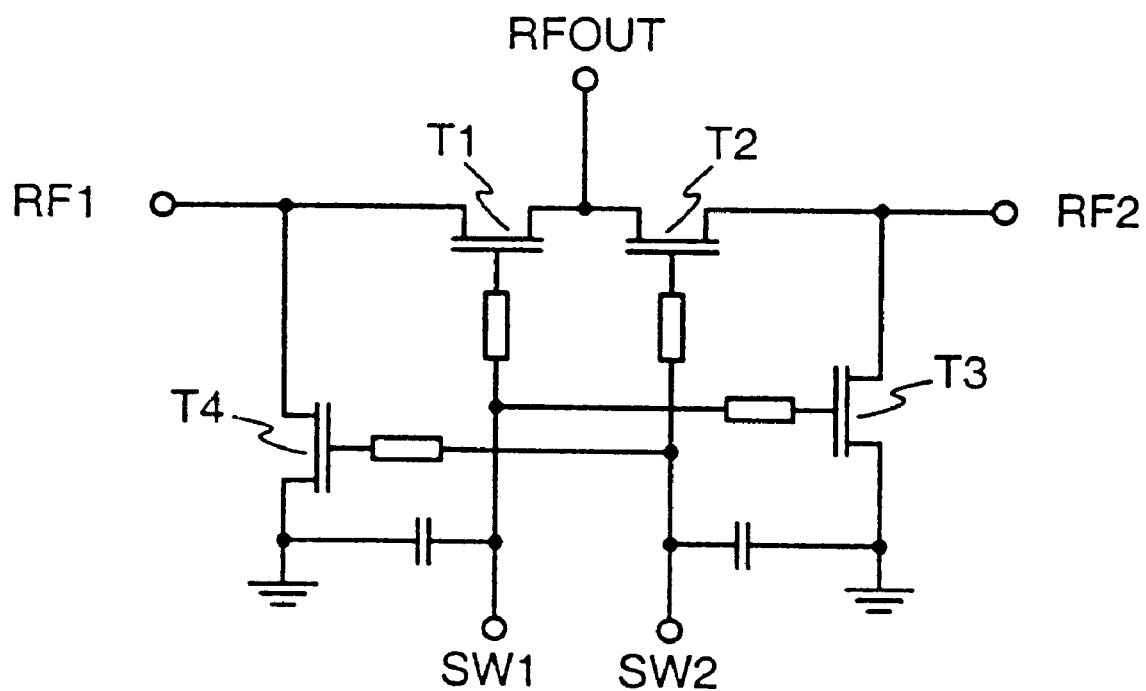
FIG. 16 illustrates a MOSFET transistor switch, which can be used in an advantageous embodiment of the invention.

In an advantageous embodiment of the invention, the switches are realised with active semiconductor elements such as MESFET or MOSFET transistors or PIN diodes or other active switches having fast switching speed and low on-state resistance. FIG. 16 shows an example of a MOSFET based switch structure, which can be used in an embodiment of the invention. The switch is an SP2T (single pole dual throw) switch. The switch has two RF inputs RF1, RF2 and one RF otput RFOUT, and two control inputs SW1, SW2. The state of the switch is chosen by applying a positive control voltage to one of the inputs SW1 and SW2 and a zero control voltage to the other. When transistor T1 is rendered into conductive stage by the control voltage, signal RF1 is passed to output RFOUT, while signal RF2 is shorted to ground via transistor T3. When transistor T2 is rendered into conductive stage by the control voltage, signal RF2 is passed to output RFOUT, while signal RF1 is shorted to ground via transistor T4. Since a man skilled in the art knows many other different transistor switch structures capable of operating at a high frequency, such structures are not described here in further detail.

According to a further advantageous embodiment of the invention, the substrate on which the resonator and switching means are deposited is used as a substrate, on which other components are attached. For example, the substrate may provide wiring connections for other components, which wiring connections are realized as electrically conducting patterns on the substrate surface. Components such as integrated circuits can subsequently be bonded on the substrate. For example, unpackaged integrated circuits can be bonded directly on the substrate using flip-chip bonding technique. Such an embodiment is especially advantageous, when glass is used as the substrate material, since the low cost of glass substrates allow relatively large substrates to be produced, whereby such substrates can accommodate other components in addition to the deposited resonator and switch structures.

Resonator and switch structures according to the invention are advantageously used at frequencies roughly at or higher than 400 MHz, i.e. at frequencies where BAW resonators are feasible.

The invention provides combined resonator and switch structures, which are economical to produce, since such structures can be produced in a single fabrication process. The invention further allows the production of complicated switched resonator and filter structures having a very small size, which is a substantial advantage in constructing multi-system mobile communication means.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention. For example, the resonators may be SAW or BAW resonators, and the switch elements may be transistors or micromechanical switches. An essential feature of the invention is, that the resonators and the switch elements have been prepared at least by deposition and patterning of a plurality of layers on the substrate.

What is claimed is:

1. A resonator structure comprising at least one resonator on a substrate, which resonator is prepared at least by deposition and patterning of a plurality of layers on the substrate, wherein the structure comprises at least one switch element prepared at least by deposition and patterning of a plurality of layers on the substrate, at least one of said at least one switch element being a micromechanical switch.

2. A resonator structure according to claim 1, wherein at least one of said at least one switch element has at least one transistor.

3. A resonator structure according to claim 1, wherein at least one transistor is integrated on the substrate.

4. A resonator structure according to claim 1, wherein at least one of the at least one resonator is a bulk acoustic wave resonator.

5. A resonator structure according to claim 1, wherein at least one of the at least one resonator is a surface acoustic wave resonator.

6. A resonator structure according to claim 1, wherein at least one of the at least one resonator has at least one layer, said at least one layer being a part of the same layer, of which at least one layer of at least one of said at least one micromechanical switch is a part.

7. A resonator structure according to claim 1, wherein the resonator structure comprises at least one filter.

8. A resonator structure according to claim 1, wherein the resonator structure comprises at least one modulator.

9. A resonator structure according to claim 1, wherein the resonator structure is a switched resonator bank of a switched filter bank.

10. A mobile communication device, comprising:
a resonator structure having at least one resonator on a substrate, which resonator is prepared at least by deposition and patterning of a plurality of layers on the substrate, and
at least one switch element prepared at least by deposition and patterning of a plurality of layers on the substrate, at least one of said at least one switch elements being a micromechanical switch.

* * * * *